(12) United States Patent
Liu et al.

(10) Patent No.: US 11,069,749 B2
(45) Date of Patent: Jul. 20, 2021

(54) PIXEL DISPLAY MODULE AND MASK FOR MANUFACTURING THE PIXEL DISPLAY MODULE

(71) Applicant: KunShan Go-Visionox Opto-Electronics Co., Ltd., Kunshan (CN)

(72) Inventors: Mingxing Liu, Kunshan (CN); Junfeng Li, Kunshan (CN); Xuliang Wang, Kunshan (CN); Dongyun Lv, Kunshan (CN); Shuaiyan Gan, Kunshan (CN); Feng Gao, Kunshan (CN)

(73) Assignee: Kunshan Go-Visionox Opto-Electronics Co., Ltd., Jiangsu (CN)

(*) Notice: Subject to any disclaimer, the term of this patent is extended or adjusted under 35 U.S.C. 154(b) by 9 days.

(21) Appl. No.: 16/692,415

(22) Filed: Nov. 22, 2019

(65) Prior Publication Data

US 2020/0185463 A1 Jun. 11, 2020
US 2021/0151520 A9 May 20, 2021

Related U.S. Application Data

(63) Continuation-in-part of application No. PCT/CN2019/088556, filed on May 27, 2019.

(30) Foreign Application Priority Data

Jun. 27, 2018 (CN) .......................... 201810679353.7

(51) Int. Cl.
*H01L 29/20* (2006.01)
*H01L 27/32* (2006.01)
*H01L 51/56* (2006.01)

(52) U.S. Cl.
CPC .......... *H01L 27/3218* (2013.01); *H01L 51/56* (2013.01)

(58) Field of Classification Search
CPC ............. H01L 27/3218; H01L 27/3213; H01L 27/3216; H01L 51/56; G02F 1/133514
See application file for complete search history.

(56) References Cited

U.S. PATENT DOCUMENTS

| 9,293,516 B2 | 3/2016 | Choi et al. |
| 2003/0160915 A1* | 8/2003 | Liu .................. G02F 1/133514 349/106 |

(Continued)

FOREIGN PATENT DOCUMENTS

| CN | 103123927 B | 5/2015 |
| CN | 205231067 U | 5/2016 |

(Continued)

OTHER PUBLICATIONS

European Search Report for Application No. 19825098.7 dated Nov. 27, 2020.

(Continued)

*Primary Examiner* — Phuc T Dang
(74) *Attorney, Agent, or Firm* — Ladas & Parry LLP

(57) ABSTRACT

The embodiments of the present application provide a pixel display module. The pixel display module includes: a plurality of array-distributed pixel unit groups. Each of the pixel unit groups comprises four array-distributed sub-pixels, two of the sub-pixels located on a diagonal of each of the pixel unit groups emit a same first color light, and the other two of sub-pixels located on another diagonal of each of the pixel unit groups respectively emit a second color light and a third color light. Two pixel unit groups adjacent in a first direction are staggered along a second direction, and the second direction is perpendicular to the first direction.

13 Claims, 4 Drawing Sheets

(56) References Cited

U.S. PATENT DOCUMENTS

| | | |
|---|---|---|
| 2007/0266943 A1 | 11/2007 | Yeh et al. |
| 2010/0039011 A1 | 2/2010 | Karaki et al. |
| 2011/0234550 A1* | 9/2011 | Hong .................... H01L 27/326 345/204 |
| 2013/0147852 A1* | 6/2013 | Hsieh ................... H04N 13/31 345/690 |
| 2016/0104413 A1 | 4/2016 | Matsueda et al. |
| 2017/0133440 A1 | 5/2017 | Wang et al. |
| 2017/0249889 A1 | 8/2017 | Wang et al. |
| 2017/0294491 A1 | 10/2017 | Jo et al. |
| 2018/0182827 A1* | 6/2018 | Kim .................... H01L 27/3258 |
| 2019/0011830 A1* | 1/2019 | Ji ......................... H01L 27/326 |
| 2019/0326365 A1* | 10/2019 | Jin ...................... H01L 27/3218 |
| 2020/0251534 A1* | 8/2020 | Lan .................... H01L 27/3218 |

FOREIGN PATENT DOCUMENTS

| | | |
|---|---|---|
| CN | 105789261 A | 7/2016 |
| CN | 106486513 A | 3/2017 |
| CN | 106653804 A | 5/2017 |
| CN | 107038967 A | 8/2017 |
| CN | 107464831 A | 12/2017 |
| CN | 108598141 A | 9/2018 |
| EP | 2950348 A1 | 12/2015 |
| JP | 2005-208522 A | 8/2005 |
| JP | 2006-209902 A | 9/2008 |
| WO | 2006/093862 A1 | 8/2008 |

OTHER PUBLICATIONS

Chinese First Office Action for CN Application No. 201810679353.7 dated Sep. 3, 2019.
Translation of First Office Action for CN Application No. 20180679353.7 dated Sep. 3, 2019.
PCT International Search Report of PCT/CN2019/088556 dated Sep. 4, 2019.
PCT Written Opinion of PCT/CN2019/088556 dated Sep. 4, 2019.
Japanese Notice of Reasons for Refusal for application 2020-515715 dated Apr. 6, 2021.

* cited by examiner

US 11,069,749 B2

PIXEL DISPLAY MODULE AND MASK FOR MANUFACTURING THE PIXEL DISPLAY MODULE

CROSS-REFERENCE TO ASSOCIATED APPLICATIONS

This application is a Continuation-In-Part Application of PCT application No. PCT/CN2019/088556, filed on May 27, 2019 which claims priority to CN Patent Application No. 201810679353.7, filed on Jun. 27, 2018. All of the aforementioned applications are hereby incorporated by reference in their entireties.

TECHNICAL FIELD

Embodiments of the present application relate to the field of display technology, and particularly to a pixel display module and a mask for manufacturing the pixel display module.

BACKGROUND

Most of current display screens use three-color sub-pixels as a primary color for color display, especially RGB as the most common application of three-color. A change of color can be realized through a change of three color channels of red R, green G and blue B and their superposition, which is one of color systems used widely.

The performance of the display is usually represented by a display resolution. The display resolution is a quantity of individual pixels that can be displayed in each dimension (i.e. 1920*1080), or the performance of the display is usually represented by a display density that is a relative quantity of pixels in per inch (aka pixels per inch PPI).

At present, the display device with a high PPI and a high resolution has become mainstream product in the field of display technology. However, an organic light-emitting layer of an OLED is manufactured by an evaporation technique using a fine metal mask (FMM). However, technology precision of composing a picture on organic materials is high, and so the minimum size of each layer is limited. When forming the OLED on a same plane, a sufficient space must be maintained between adjacent pixels to avoid overlapping of adjacent organic light-emitting layers. Therefore, due to the limitations of the fine metal mask and the evaporation process itself, for example a mask opening cannot be made smaller. Even though the high PPI can be achieved through an arrangement of pixels, the evaporation process using two or more masks increases the cost and process time.

SUMMARY

In view of this, embodiments of the present application provide a pixel display module and a mask for manufacturing the pixel display module in order to solve the problem that it is difficult to manufacture display devices with high PPI and uniformity.

An aspect of the present application provides a pixel display module, including: a plurality of array-distributed pixel unit groups. Each pixel unit group includes four array-distributed sub-pixels.

Two sub-pixels located on a diagonal of each pixel unit group emit a same first color light, and two sub-pixels located on other diagonal of each pixel unit group respectively emit a second color light and a third color light. Two pixel unit groups adjacent in a first direction are staggered along a second direction, and the second direction is perpendicular to the first direction.

An aspect of the present application provides a mask for manufacturing the pixel display module, including: a plurality of open areas, wherein at least one open area corresponds to two sub-pixels which are respectively belong to the two adjacent pixel unit groups, are adjacent to each other, are located in a same row or in a same column and emits the same color light.

The embodiments of the present application provide a pixel display module, and the pixel display module includes a plurality of array-distributed pixel unit groups. Each pixel unit group includes four array-distributed sub-pixels. Two sub-pixels located on a diagonal of each the pixel unit groups emit a same first color light, and two sub-pixels located on other diagonal of each pixel unit group respectively emit a second color light and a third color light. It is ensured that two sub-pixels that emit a same color light are staggered in position, and the display effect is more uniform.

DETAILED DESCRIPTION

Technical solutions in embodiments of the present application are clearly and completely described in the following with reference to accompanying drawings in the embodiments of the present application. Obviously, described embodiments are only a part of embodiments of the present application, and are not all embodiments. All other embodiments obtained by those skilled in the art based on the embodiments of the present application without creative efforts belong to protective scope of the present application.

Figure 1:
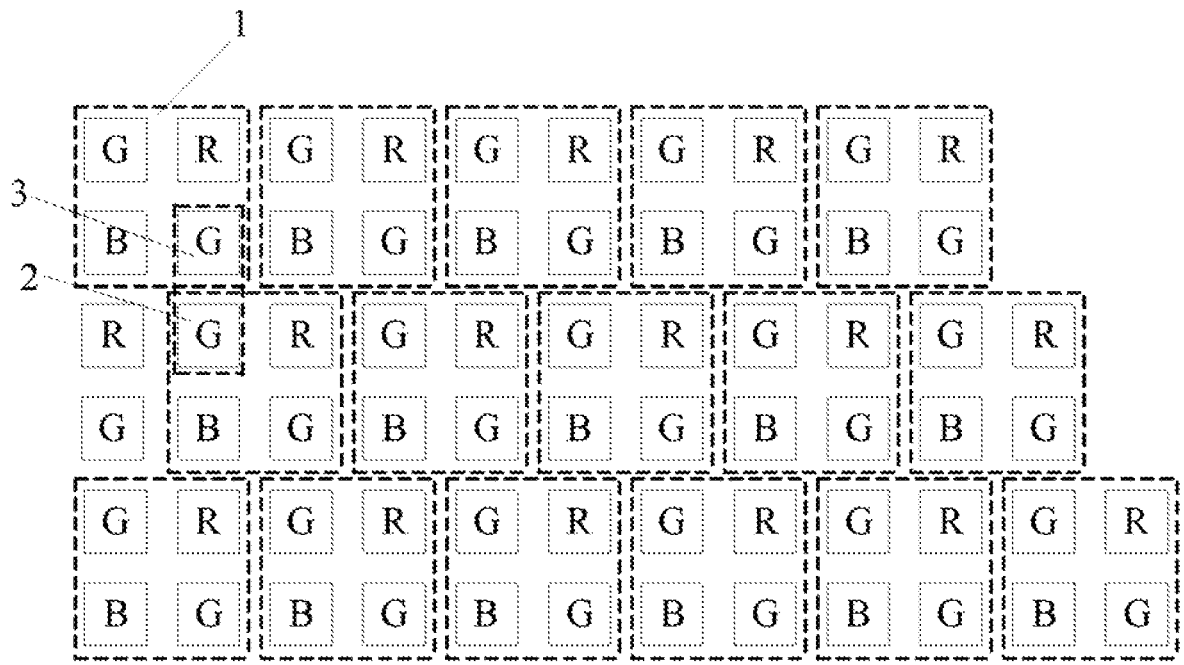
FIG. 1 is a schematic structural diagram of a pixel display module according to an embodiment of the present application.
Figure 2:
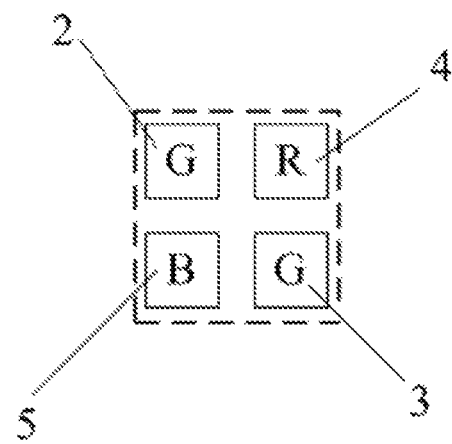
FIG. 2 is a diagram of a pixel distribution of a pixel unit group in a pixel display module according to an embodiment of the present application.

FIG. 1 is a schematic structural diagram of a pixel display module according to an embodiment of the present application. As shown in FIG. 1, the pixel display module includes a plurality of array-distributed pixel unit groups 1. Each pixel unit group 1 includes four array-distributed sub-pixels. As shown in FIG. 2, a sub-pixel 2 and a sub-pixel 3 located on a diagonal of a pixel unit group 1 emit a same first color light, and a sub-pixel 4 and a sub-pixel 5 located on other diagonal of the pixel unit group 1 respectively emit a second color light and a third color light.

Which diagonal having sub-pixels that emit the same color light of the pixel unit group may be selected according to actual needs and manufacture process. In an embodiment of the present application, The sub-pixel 4 and the sub-pixel 5 located on a diagonal of the pixel unit group 1 emit the same first color light, and the sub-pixel 2 and the sub-pixel 3 located on other diagonal of the pixel unit group 1 respectively emit the second color light and the third color light.

The embodiments of the present application provide the pixel display module including the plurality of array-distributed pixel unit groups 1. Each pixel unit group 1 includes four array-distributed sub-pixels. Two sub-pixels located on a diagonal of each pixel unit group emit the same first color light, and two sub-pixels located on other diagonal of each pixel unit group respectively emit the second color light and the third color light. It is ensured that two sub-pixels that emit the same color light are staggered in position, and the uniformity of the display can be improved.

An embodiment of the present application provides a pixel display module. Two pixel unit groups adjacent in a first direction are staggered along a second direction, and the second direction is perpendicular to the first direction. In an embodiment of the present application, the first direction is a column direction, and the second direction is a row direction correspondingly. Two pixel unit groups 1 adjacent in the column direction are staggered along the row direction, which may be staggered to the right or left. A staggered distance is less than a distance of one sub-pixel in the row direction, i.e., in the two pixel unit groups adjacent in the column direction, one sub-pixel in a following pixel unit group 1 is located between two pixels in the above pixel unit group 1.

When people see the array-distributed pixel display module, a direction of moving along the left and right direction of eyes is defined as the row direction of the pixel display module, and a direction of moving along the up and down direction of the eyes is defined as the column direction of the pixel display module.

In embodiments of the present application, the staggered distance along the row direction of the two pixel unit groups 1 that are adjacent in the column direction may be selected according to the actual pixel requirements and process requirements. The staggered distance may be less than the distance of one sub-pixel in the row direction, or the staggered distance may be more than the distance of one sub-pixel in the row direction, or the staggered distance may be equal to the distance of one sub-pixel, which is not limited in the embodiments of the present application.

In an embodiment of the present application, the first direction is the row direction, and the second direction is the column direction correspondingly. Two pixel unit groups 1 adjacent are staggered a distance along the column direction and the distance may be selected according to the actual pixel requirements and process requirements, which is not limited in the embodiments of the present application.

In a pixel display module provided by an embodiment of the present application, Two pixel unit groups 1 adjacent are staggered, so that the sub-pixels emitting the first color light, the sub-pixels emitting the second color light, and the sub-pixels emitting the third color light are uniformly displayed in the column direction or the row direction.

Figure 3:
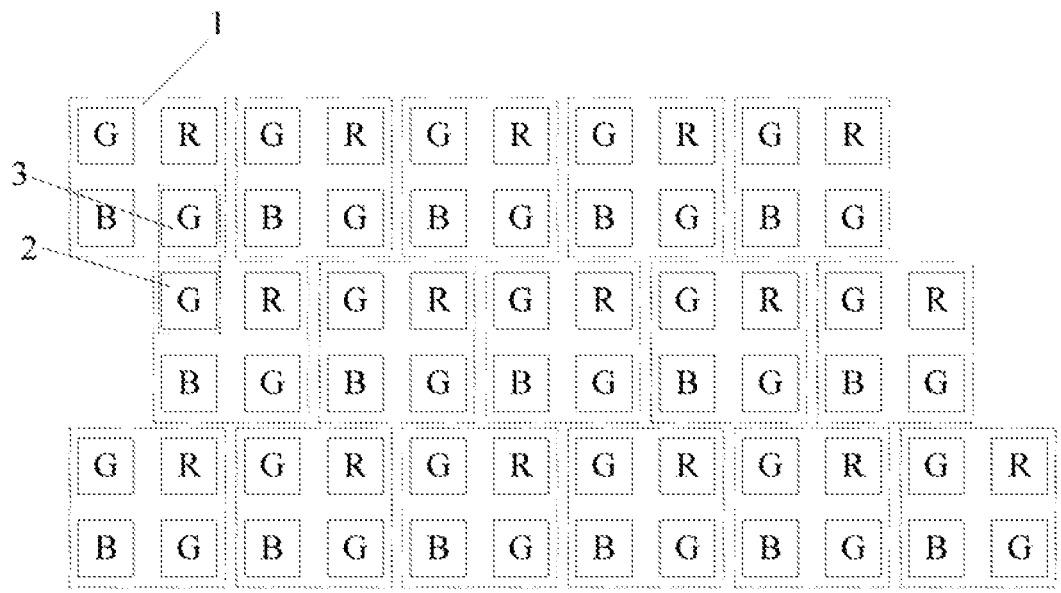
FIG. 3 is a diagram of a distribution of two adjacent pixel unit groups in a pixel display module according to an embodiment of the present application.

A pixel display module is provided by an embodiment of the present application, as shown in FIG. 3. A first direction is a column direction, and a second direction is a row direction correspondingly. Two pixel unit groups adjacent to each other in the column direction are staggered to the right by a distance of one sub-pixel along the row direction. That is to say, in the column direction, a first sub-pixel 2 of a first row in a first pixel unit group 1 located in a lower row is located directly below a second sub-pixel 3 of a second row in a first pixel unit group 1 located in a upper row, and the first sub-pixel 2 and the second sub-pixel 3 emit a same color light. In an embodiment of the present application, the first sub-pixel 2 and the second sub-pixel 3 emit a first color light, i.e., two sub-pixels on a diagonal of the pixel unit group 1 emit a same color light. In an embodiment of the present application, two sub-pixels on a diagonal of the pixel unit group 1 emit green light.

In a pixel display module provided by an embodiment of the present application, two pixel unit groups adjacent in the column direction are staggered a distance of one sub-pixel along the row direction. Two sub-pixels, which are adjacent to each other in the column direction and are respectively belong to the two adjacent pixel unit groups, emit a same color light. The two sub-pixels that emit the same color light can share one opening on the mask to increase the aperture ratio of the display device. Under the process conditions, a pixel unit of a smaller size can be fabricated; thereby the PPI of the display device is increased.

Figure 4:
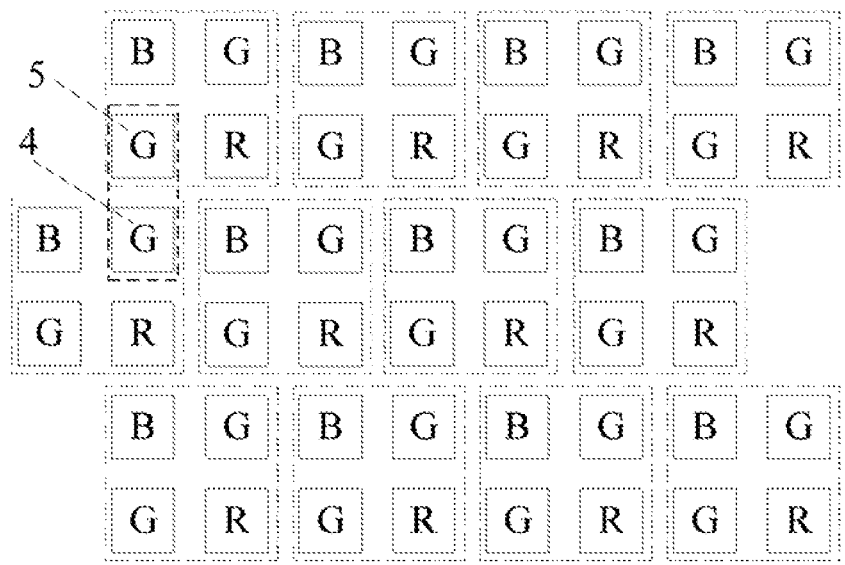
FIG. 4 is a diagram of a distribution of two adjacent pixel unit groups in a pixel display module according to an embodiment of the present application.

In order to make two adjacent sub-pixels, which are respectively belong to two pixel unit groups and are adjacent in the column direction, emit a same color light, two pixel unit groups adjacent in the column direction are staggered in the row direction with a distance of one sub-pixel along the row direction. Whether the lower pixel unit group staggers to the left or the right relative to the upper pixel unit group may be selected according to the arrangement of sub-pixels in the pixel unit groups. In an embodiment of the present application, as is shown in FIG. 4, when two pixel unit groups adjacent in the column direction stagger with each other along the row direction, the group of pixel units in the next row staggers a distance of one sub-pixel along the row direction to the left along the row direction. That is to say, a second sub-pixel 4 of a first row in a first pixel unit group 1 located in a lower row is located directly below a first sub-pixel 5 of a second row in the first pixel unit group 1 located in a upper row, which is not limited in the embodiments of the present application.

Figure 5:
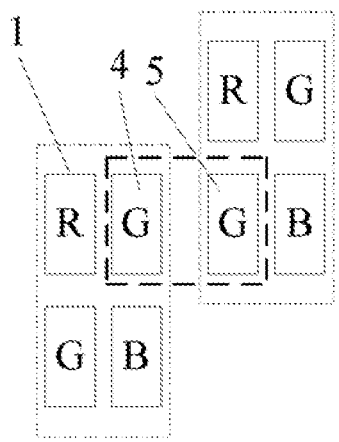
FIG. 5 is a diagram of a distribution of two adjacent pixel unit groups in a pixel display module according to an embodiment of the present application.
Figure 6:
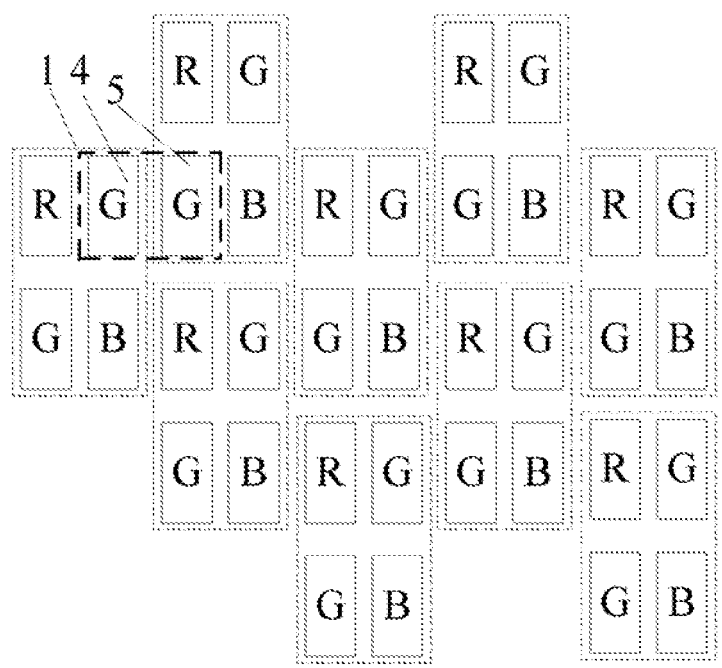
FIG. 6 is a schematic structural diagram of a pixel display module according to an embodiment of the present application.

When the first direction is a row direction, the second direction is a column direction, in order to make array-distributed pixel unit groups in a pixel display module achieve that two adjacent sub-pixels respectively belong to two adjacent pixel unit groups 1 emit the same color light, not only two adjacent pixel unit groups 1 in the column direction can be staggered a distance of one sub-pixel along the row direction, but also two adjacent pixel unit groups 1 in the row direction can be staggered a distance of one sub-pixel distance along the column direction. As is shown in FIG. 5, two pixel unit groups 1 adjacent in the row direction are staggered a distance of one sub-pixel distance along the column direction, i. e., in the row direction, a first sub-pixel 5 of a second row of a right first pixel unit group is located in the right side or the left side of a second sub-pixel 4 of a first row of a left first pixel unit group, and the first sub-pixel 5 and the second sub-pixel 4 emit a same color light. A schematic structural diagram of the pixel display module composed of the array-distributed pixel unit groups is shown in FIG. 6.

The manner, in which two pixel unit groups adjacent in the row direction are staggered along the column direction, is selected according to the sub-pixel arrangement in the pixel unit groups, which is not limited in the embodiment of the present application.

Figure 7:
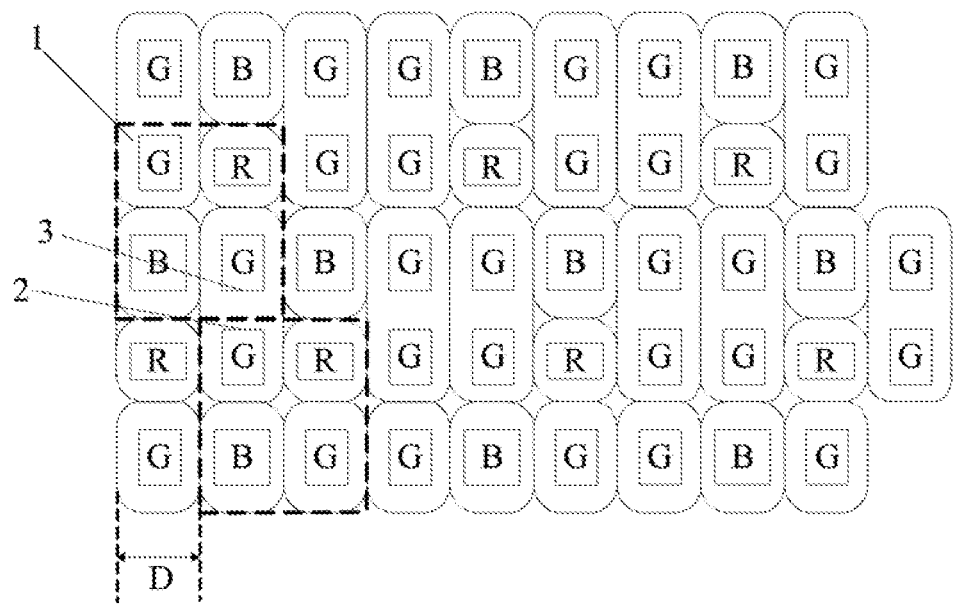
FIG. 7 is a schematic structural diagram of a pixel display module according to another embodiment of the present application.

The distance, mentioned above, of a sub-pixel refers to a distance of a sub-pixel in a direction in which two adjacent pixel unit groups are staggered with each other. That is to say, as shown in FIG. 7, when two adjacent pixel unit groups are staggered with each other along the row direction, the distance of one sub-pixel D is equal to the length of a sub-pixel itself in the row direction plus a length of right isolation column connected to the sub-pixel in the row direction, and plus a length of the left isolation column connected to the sub-pixel in the row direction.

The embodiments of the present application provide a pixel display module, and the pixel display module includes a plurality of array-distributed pixel unit groups. Each pixel unit group includes four array-distributed sub-pixels. Two sub-pixels located on a diagonal of each pixel unit group emit a same first color light, and two sub-pixels located on other diagonal of each pixel unit group respectively emit a second color light and a third color light. The first color light is green light, and the second color light and the third color light are respectively red light and blue light.

The colors of the first color light, the second color light and the third color light can be selected according to actual need. In another embodiment of the application, the first color light may be blue light, and the second color light and the third color light may be respectively red light and green light. In another embodiment of the application, the first color light may be red light, and the second color light and the third color light may be respectively green light and blue light.

The embodiments of the present application provide a pixel display module. In order to reduce the difficulty of masking a mask during the manufacturing process, a shape of the pixel unit group is a rectangle, so that the entire pixel is arranged in a rectangular array, which reduces the difficulty of masking the web. A length and a width of the rectangle may be selected according to actual need and process. In an embodiment of the present application, a shape of the pixel unit group is a square, which is not limited in the embodiments of the present application.

In order to make a pixel unit group rectangular, shapes of four sub-pixels in the pixel unit group is designed according to the actual application scenario. For example, the shapes of four sub-pixels in the pixel unit group may all be square, or may all be rectangular, may partially be rectangular and partially be square, as shown in FIG. 7. As long as a shape of a pixel unit group composed of four sub-pixels is rectangular, the shapes of the four sub-pixels in the pixel unit group are not limited in the embodiments of the present application.

Figure 8:
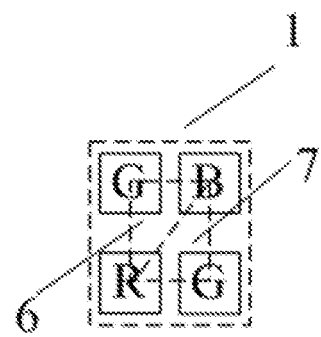
FIG. 8 is a diagram of a distribution of a first pixel unit group and a second pixel unit group in a pixel display module according to an embodiment of the present application.

The embodiments of the present application provide a pixel display module, and the pixel display module includes a plurality of array-distributed pixel unit groups 1. Each pixel unit group 1 comprises a first pixel unit 6 and a second pixel unit 7. As is shown FIG. 8, the first pixel unit 6 or the second pixel unit 7 is composed of three sub-pixels emitting different color lights. The first pixel unit 6 and the second pixel unit 7 share two sub-pixels, which respectively emit a second color light and a third color light and locate on a diagonal of the pixel unit group 1. When the pixel unit group emits light, the first pixel unit 6 and the second pixel unit 7 share the two sub-pixels, which emit the different light and locate on a diagonal of the pixel unit group; and two sub-pixels, not be shared by the first pixel unit 6 and the second pixel unit 7, emit a same color light. Thus, the display uniformity of the pixel unit group 1 is improved.

Figure 9:
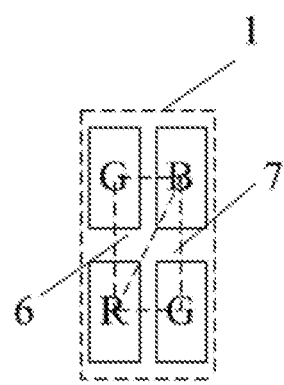
FIG. 9 is a diagram of a distribution of a first pixel unit group and a second pixel unit group in a pixel display module according to an embodiment of the present application.

In an embodiment of the present application, in the pixel unit group 1, a distance between two sub-pixels in the column direction is twice a distance between two sub-pixels in the row direction. As shown in FIG. 9, the distance between two sub-pixels refers to a distance between the centers of two sub-pixels. According to the pixel display module provided the embodiment of the present application, the distance between two sub-pixels of the pixel unit group in the column direction is twice the distance between two sub-pixels in the row direction. Since the first pixel unit 6 and the second pixel unit 7 share the two sub-pixels which emit the different light, when the sub-pixels are displayed under the driving mode, the display units of the first pixel unit 6 and the second pixel unit 7 are all square, which has no effect on the displaying signal and displaying proportion of the display device.

In order to achieve that the distance between two sub-pixels of the pixel unit group in the column direction is twice the distance between two sub-pixels in the row direction, in an embodiment of the present application, the shapes of the four sub-pixels in each pixel unit group 1 are rectangular as shown in FIG. 9. A shape of each sub-pixel of the four sub-pixels in each pixel unit group 1 may be selected according to a specific application scenario, for example, the shape may be a square, or may be a rectangle the four corners of which are rounded. The shape of the sub-pixel is not limited in the embodiments of the application.

The embodiments of the present application provide a mask for manufacturing the pixel display module. The mask includes a plurality of open areas, and at least one open area corresponds to two sub-pixels, which are respectively belong to the two adjacent pixel unit groups, are located in a same row or in a same column and emit the same color light. Since sub-pixels emitting different colors in a pixel structure are made by different evaporation processes, the masks corresponding to the sub-pixels emitting different colors are also different. An opening on the mask for manufacturing the pixel display module according to the embodiments of the application corresponds to two adjacent sub-pixels, which emit a same color light and respectively belong to two adjacent pixel unit groups. When the PPI of the display device is higher, the difficulty of manufacturing the mask is reduced, and the effect of the pixel structure obtained by evaporation is better.

The above is only the preferred embodiment of the present application, and that is not intended to limit the present invention. Any modifications, equivalents, and the like made within the spirit and principles of the present invention should be included in the scope of the present invention.

What is claimed is:

1. A pixel display module, comprising: a plurality of array-distributed pixel unit groups;
    wherein each of the pixel unit groups comprises four array-distributed sub-pixels, two of the sub-pixels located on a diagonal of each of the pixel unit groups emit a same first color light, and the other two of sub-pixels located on another diagonal of each of the pixel unit groups respectively emit a second color light and a third color light; two pixel unit groups adjacent with each other in a first direction are staggered a certain distance along a second direction perpendicular to the first direction, and the certain distance is equal to a length of one sub-pixel along the second direction;

wherein the sub-pixels in the two pixel unit groups staggered along the second direction respectively comprise one selected sub-pixel, the two selected sub-pixels are adjacent to each other located in a same column or in a same row and emit a same color light;

wherein a color distribution of the four array-distributed sub-pixels in each of the pixel unit groups is identical.

2. The pixel display module of claim 1, wherein the two selected sub-pixels emit the first color light.

3. The pixel display module of claim 2, wherein the first color light is green light.

4. The pixel display module of claim 3, wherein a shape of the pixel unit group is rectangular.

5. The pixel display module of claim 4, wherein shapes of the four sub-pixels in the pixel unit group are square.

6. The pixel display module of claim 1, wherein,
the first color light is green light, and the second color light and the third color light are respectively red light and blue light; or,
the first color light is blue light, and the second color light and the third color light are respectively red light and green light; or,
the first color light is red light, and the second color light and the third color light are respectively green light and blue light.

7. The pixel display module of claim 1, wherein each of the pixel unit groups comprises a first pixel unit and a second pixel unit, the first pixel unit or the second pixel unit is composed of three sub-pixels emitting different color lights, and when the pixel unit group emits light, the first pixel unit and the second pixel unit share two of the three sub-pixels, on a diagonal of the pixel unit group and respectively emit the second color light and the third color light.

8. The pixel display module of claim 7, wherein in each of the pixel unit groups, a distance between two of the three sub-pixels in a column direction is twice a distance between two of the sub-pixels in a row direction.

9. The pixel display module of claim 7, wherein a display unit of the first pixel unit or the second pixel unit has a square shape when the four sub-pixels in the pixel unit group are displayed under a driving mode.

10. The pixel display module of claim 1, wherein there is a gap between the two selected sub-pixels located in a same column or in a same row.

11. The pixel display module of claim 1, wherein sizes of the four sub-pixels in the pixel unit group are identical.

12. The pixel display module of claim 1, wherein a shape of the pixel unit group is square.

13. The pixel display module of claim 1, wherein each of the four sub-pixels in the pixel unit group has a rectangle shape with four rounded corners.

* * * * *